United States Patent [19]

Bryan et al.

[11] Patent Number: 5,227,129
[45] Date of Patent: Jul. 13, 1993

[54] METHOD FOR APPLYING CORROSION RESISTANT METALLIC COATING OF ZIRCONIUM NITRIDE

[75] Inventors: William J. Bryan; Lawrence V. Corsetti, both of Granby, Conn.

[73] Assignee: Combustion Engineering, Inc., Windsor, Conn.

[21] Appl. No.: 960,268

[22] Filed: Oct. 13, 1992

Related U.S. Application Data

[62] Division of Ser. No. 514,870, Apr. 26, 1990, abandoned.

[51] Int. Cl.$^5$ .................................................. G21C 3/00
[52] U.S. Cl. ..................................... 376/414; 376/416; 376/457
[58] Field of Search ............... 376/414, 416, 457, 434, 376/438; 420/422; 427/295, 37; 976/DIG. 45

[56] References Cited

U.S. PATENT DOCUMENTS

| | | | |
|---|---|---|---|
| 4,029,740 | 6/1977 | Ervin | 423/251 |
| 4,724,016 | 2/1988 | Anthony | 148/421 |
| 4,761,346 | 8/1988 | Naik | 428/627 |
| 4,880,597 | 11/1989 | Bryan | 376/419 |
| 4,990,303 | 2/1991 | Bryan | 376/419 |
| 5,026,517 | 6/1991 | Menken | 376/438 |

OTHER PUBLICATIONS

High Speed Plasma Streams in Vacuum Arcs, A. A. Plyutto, V. N. Ryzhkov and A. T. Kapin.
Very High Rate Reactive Sputtering of TiN, ZrN and HfN William D. Sproul.
Thermal Spray Coatings—James H. Clare and Daryl E. Crawmer pp. 361–426.

Primary Examiner—Donald P. Walsh
Assistant Examiner—Meena Chelliah
Attorney, Agent, or Firm—Chilton, Alix & Van Kirk

[57] ABSTRACT

A corrosion resistant metallic coating (60) of zirconium nitride is applied to the cladding tube (40) of a nuclear fuel rod (20). The zirconium nitride is reactively deposited on a zirconium-alloy cladding tube by a cathodic arc plasma deposition process. The zirconium nitride coating provides superior wear test results and enhances the corrosion resistance of the cladding tube.

11 Claims, 1 Drawing Sheet

METHOD FOR APPLYING CORROSION RESISTANT METALLIC COATING OF ZIRCONIUM NITRIDE

This is a divisional of copending application Ser. No. 07/514,870 filed on Apr. 26, 1990 abandoned.

BACKGROUND OF THE INVENTION

This invention relates generally to fuel rods employed in nuclear reactors. More particularly, the present invention relates to fuel rods having a zirconium-alloy cladding tube which contains fuel pellets.

Fuel rods having outer cladding tubes are mounted in support grids of the reactor fuel assembly. Because of the harsh environment of the fuel assembly where the surrounding water temperature is typically 400° C. and the water has a relatively high pressure, the cladding tube is susceptible to wear and corrosion. At the lower portions of the reactor assembly, the cladding tubes are exposed to debris fretting. In addition, there are severe wear forces at the location of the grid support.

A number of advancements have been introduced in some industrial applications to improve the ability of metallurgical thin film to combat wear, to resist chemical corrosion, to protect substrates from hostile environments and to resist erosion. For example, ion-assisted vacuum deposition techniques such as cathodic arc plasma deposition (CAPD) have been employed for depositing thin films on substrates to be protected. CAPD processes have achieved superior film bonding and higher densities than more conventional ion plated films.

The conventional CAPD system includes a vacuum chamber, a cathode, an arc power supply, means of igniting an arc on the cathode surface, an anode and a substrate bias power supply. A vacuum arc is employed to evaporate the source material which functions as the cathode in the arc circuit. A voltage in the range of 15 to 50 volts is typically employed to sustain the arc. The voltage level is dependent upon the cathode material.

Arcing is initiated by applying a high voltage pulse to an electrode near the cathode and/or by mechanical ignition. Evaporation occurs due to high velocity arc spots traversing across the cathode surface at velocities as great as 100 m/second. The arc spots carry high current densities and are sustained by the plasma that is generated by the arc. The high current density results in flash evaporation of the source material. The resulting vapor consist of electrons, ions, neutral vapor atoms and microdroplets. The electrons are accelerated toward a cloud of positive ions. Emissions from the cathode spots remain relatively constant over a wide range of arc currents as the cathode spots split into a multiplicity of spots. The average current carried per spot depends on the nature of the cathode material.

SUMMARY OF THE INVENTION

Briefly stated, the invention in a preferred form is a cladding tube for a nuclear fuel rod which has a thin film of zirconium nitride coating the outside surface. The zirconium nitride coat may be applied on a portion of the tube which will be located below or in the vicinity of a particular fuel assembly support grid, or on substantially the entire outside surface of the tube. A film having a thickness of approximately 5 microns is effective in resisting corrosion and wear of the cladding tube, which usually has a zirconium-alloy composition.

The thin film of zirconium nitride is applied to the cladding tube by reactively depositing zirconium nitride on the surface of the cladding tube by a cathodic arc plasma deposition process. The cladding tube is heated to a temperature in the range of approximately 300° to 400° C. in the presence of nitrogen in a vacuum chamber.

An object of the invention is to provide a new and improved corrosion resistant coating for a cladding tube employed in a nuclear reactor.

Another object of the invention is to provide a new and improved coating which may be applied to a zirconium-alloy cladding tube in an efficient and cost effective manner.

A further object of the invention is to provide a new and improved coating for a cladding tube which has enhanced resistance to debris fretting and corrosion and has an outer diameter which does not sufficiently increase the fuel assembly pressure drop.

Other objects and advantages of the invention will become apparent from the drawings and the specification.

DESCRIPTION OF THE PREFERRED EMBODIMENT

Figure 1:
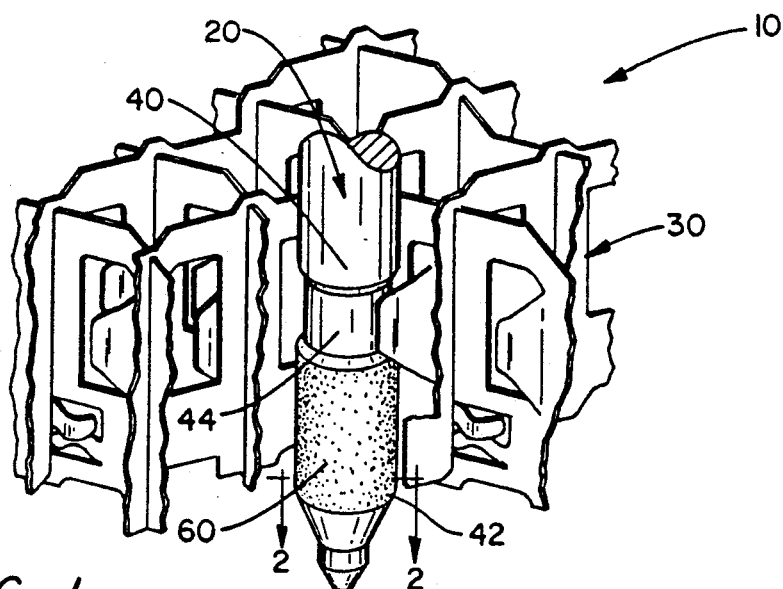
FIG. 1 is a fragmentary view, partly in schematic, of a fuel assembly containing a rod which incorporates the wear resistant coating of the present invention.

With reference to the drawings wherein like numerals represent like parts throughout the figures, a fuel assembly for which the present invention has application is generally designated by the numeral 10. Fuel assembly 10 is employed in a nuclear reactor and includes a plurality of fuel rods 20 which are mounted to a lower support grid 30. The fuel rods have a cladding tube 40 which contains fissionable fuel pellets 50. The cladding tube 40 is manufactured from a zirconium-alloy or other suitable alloy. The invention will be primarily described with reference to a zirconium-alloy cladding tube.

Figure 2:
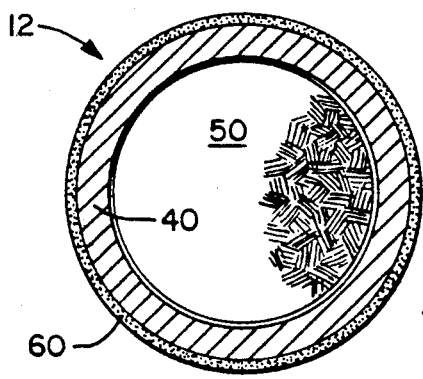
FIG. 2 is an enlarged cross-sectional view of a cladding tube of the fuel assembly of FIG. 1 taken along the line 2—2 thereof.
Figure 3:
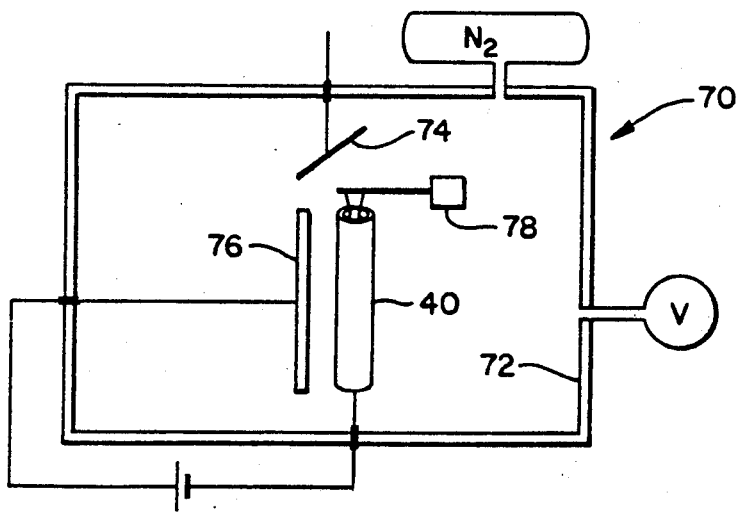
FIG. 3 is a schematic diagram of an apparatus for coating the cladding tube of FIG. 2.

In accordance with the invention, the cladding tubes have a coating 60 on at least a portion of the outside surface. The coating 60 is a thin film comprised substantially of zirconium nitride. The film may have a thickness on the order of approximately 5 microns. The relative dimension of the coating 60 is exaggerated in FIG. 2. The thin film of zirconium nitride is wear resistant, and constitutes a barrier which resists corrosion of the tube substrate. Because of the relatively thin film thickness, e.g., approximately 5 microns, the outer diameters of the coated cladding tubes or fuel rods do not significantly reduce the coolant pressure drop through the fuel assembly 10.

While the thin film of zirconium nitride may be applied to the zirconium-alloy cladding tube along substantially the entire length of the tube, the thin film is especially advantageous in the region 42 below the support grid where the tube is particularly susceptible to debris fretting due to the metallic particles and the high pressures and high temperatures of the surrounding water. In addition, the zirconium nitride coating may be applied in the region 44 of the cladding tube which is engaged by the lower support grid 30 to enhance the corrosion and wear resistance of the tube.

The zirconium nitride coating 60 is reactively deposited on the zirconium-alloy cladding tube 40 by means of a cathodic ion plating process in apparatus 70 such as, for example, a Vac-Tec ATC 400 ARC Coating System. The zirconium source material is evaporated in a vaccum chamber 72 by arc source 74. A zirconium bar functions as the cathode 76 in the arc circuit. The zirconium arc spots typically are 1 to 3 microns in diameter and have current densities as high as 10 amp per square micron. The high current density causes flash evaporation of the zirconium material. The cladding tube 40 is the anode of the arc circuit. A fixture assembly 78 which is capable of positioning and rotating the tube 40 is employed to ensure a uniform coating on the tube substrate.

Depositions of the coating were performed with tube substrate temperatures in the range of 300° to 400° C. in the presence of nitrogen at a total chamber pressure of 0.26 to 1.3 Pa. Typical deposition rates achieved were 200 to 300 nm/min. The thickness of the zirconium nitride film was approximately 3.0 to 7.0 microns.

An established negative characteristic of the cathodic arc process is that macro-particles emitted from the source material may be directly incorporated into the growing film. The macro-particles are composed primarily of unreacted material. An analysis of samples of zirconium nitride coating 60 deposited on a sample substrate revealed that the concentrations and the sizes of the zirconium macro-particles were not significant. For example, significantly lower concentration and smaller sizes of macro-particles were present for a thin coating of zirconium nitride in comparison to an analogous coating of titanium nitride.

The relatively favorable insubstantial concentration and size of the zirconium macro-particles may result from the relatively high melting point of zirconium, the low vapor pressure of zirconium and the higher arc velocity on the target surface. If the mean resident times of the cathodic arc spots are relatively small, individual vaporization events on the surface circuit may not provide sufficient time to achieve sufficient localized heating to melt the zirconium source material and thus result in emission of zirconium in the form of macro-droplets.

In one example, for a zirconium nitride coating 60 of 5 microns, the microhardness of the zirconium nitride film was measured. The hardness measurements are summarized in Table 1.

TABLE 1

| Load (g) | Microhardness (kg/mm$^2$) |
|---|---|
| 10 | 3,300 |
| 20 | 3,296 |
| 50 | 1,850 |
| 100 | 1,505 |

The measured microhardness values for zirconium nitride (ZrN) deposited by cathodic arc plasma deposition are apparently larger than those observed for similarly formed titanium nitride (TiN) films and also appear to be siginificantly larger than those reported for bulk zirconium nitride.

Wear resistant measurements of zirconium nitride coatings wherein test samples were subjected to typical fretting conditions present in a fuel rod/grid interaction indicate that a wear factor increase of in excess of 60 may be achieved by a thin coat of zirconium nitride in comparison to an uncoated zirconium-alloy fuel tube. The zirconium nitride coating 60 also functions as a corrosion resistant barrier for the zirconium-alloy cladding. The zirconium nitride coating apparently functions as a barrier to oxygen diffusion, thus enhancing the corrosion resistance of the zirconium-alloy tube.

A zirconium nitride coating may also be deposited on Inconel-alloy tubes by a cathodic arc deposition process. Test results for a zirconium nitride coating deposited on an Inconel 178-alloy test substrate revealed a wear resistance of approximately 6 when compared to the wear resistance of the test substrate. The test samples were subjected to wear conditions characteristic of fretting conditions at the fuel rod/grid interface of a reactor.

While a preferred embodiment of the invention has been set forth for purposes of illustration, the foregoing description should not be deemed a limitation of the scope of the invention. Accordingly, various modifications, adaptations and alternatives may occur to one skilled in the art without departing from the spirit and the scope of the present invention.

We claim:

1. A process for enhancing the wear and corrosion resistance of a cladding tube for a nuclear fuel rod, comprising reactively depositing zirconium nitride on the surface of said cladding tube by a cathodic arc plasma deposition process to form a thin wear resistant coating.

2. The process of claim 1 wherein the coating comprises a thin film.

3. The process of claim 2 further comprising forming a film having a thickness in the range of approximately 3-7 microns.

4. The process of claim 1 comprising depositing the zirconium nitride on a cladding tube having a zirconium-alloy composition.

5. The process of claim 1 further comprising heating the cladding tube to a temperature in the range of approximately 300° to 400° C. in the presence of nitrogen in a vacuum chamber.

6. The process of claim 1 comprising flash evaporating zirconium in a vacuum chamber in the presence of nitrogen.

7. A method for enhancing the wear and corrosion resistance of a zirconium-alloy cladding tube for a nuclear fuel rod, comprising;
supporting and heating the tube in a vacuum chamber that is back filled with nitrogen gas;
positioning zirconium source material adjacent the tube;
electrically biasing the tube as an anode and the source material as a cathode in an electric arc circuit;
initiating an electric arc on the cathode surface sufficient to produce arc spots which move along the cathode and flash evaporate source material ions from the surface of the cathode toward the tube;
forming zirconium nitride by a chemical reaction between the evaporated source material ions and the nitrogen gas as the source material ions move toward the tube;
whereby the zirconium nitride deposits as a film on the tube.

8. The method of claim 7, wherein the arc spots have a diameter in the range of about 1-3 microns.

9. The method of claim 7, wherein the arc spots move along the cathode surface at a velocity of approximately 100 m/sec.

10. The method of claim 7, wherein the current density of the arc spots is about 10 amps per square micron.

11. The method of claim 7, wherein the tube is heated to a temperature in the range of about 300° to 400° C. in the presence of said nitrogen gas at a total chamber pressure of about 0.26 to 1.3 Pa.

* * * * *